United States Patent
Haba et al.

(10) Patent No.: US 7,759,166 B2
(45) Date of Patent: Jul. 20, 2010

(54) MICROELECTRONIC PACKAGES FABRICATED AT THE WAFER LEVEL AND METHODS THEREFOR

(75) Inventors: Belgacem Haba, Saratoga, CA (US); Giles Humpston, Aylesbury (GB)

(73) Assignee: Tessera, Inc., San Jose, CA (US)

( * ) Notice: Subject to any disclaimer, the term of this patent is extended or adjusted under 35 U.S.C. 154(b) by 620 days.

(21) Appl. No.: 11/582,186

(22) Filed: Oct. 17, 2006

(65) Prior Publication Data

US 2008/0090333 A1    Apr. 17, 2008

(51) Int. Cl.
*H01L 21/00* (2006.01)

(52) U.S. Cl. .................. 438/118; 438/612; 438/613; 257/737; 257/E21.511

(58) Field of Classification Search ......... 438/106–127, 438/612, 613; 257/676, 678, 737, 783, E21.511
See application file for complete search history.

(56) References Cited

U.S. PATENT DOCUMENTS

| | | | |
|---|---|---|---|
| 4,074,342 | A | 2/1978 | Honn et al. |
| 4,500,905 | A | 2/1985 | Shibata |
| 5,466,634 | A | 11/1995 | Beilstein, Jr. et al. |
| 5,571,754 | A | 11/1996 | Bertin et al. |
| 5,716,759 | A | 2/1998 | Badehi |
| 5,804,004 | A | 9/1998 | Tuckerman et al. |
| 5,946,545 | A | 8/1999 | Bertin et al. |
| 6,022,758 | A | 2/2000 | Badehi |
| 6,040,235 | A | 3/2000 | Badehi |
| 6,177,707 | B1 | 1/2001 | Dekker et al. |
| 6,646,289 | B1 | 11/2003 | Badehi |
| 6,777,767 | B2 | 8/2004 | Badehi |
| 6,972,480 | B2 | 12/2005 | Zilber et al. |
| 6,972,483 | B1 * | 12/2005 | Song ...................... 257/690 |
| 6,984,545 | B2 * | 1/2006 | Grigg et al. ................. 438/118 |
| 2002/0127775 | A1 | 9/2002 | Haba et al. |
| 2002/0171145 | A1 | 11/2002 | Higuchi et al. |

(Continued)

FOREIGN PATENT DOCUMENTS

DE    102004039906    8/2005

(Continued)

OTHER PUBLICATIONS

U.S. Appl. No. 60/962,200.

(Continued)

*Primary Examiner*—Khiem D Nguyen
(74) *Attorney, Agent, or Firm*—Lerner, David,Littenberg, Krumholz & Mentlik, LLP

(57) ABSTRACT

A method of making microelectronic packages includes making a subassembly by providing a plate having a top surface, a bottom surface and openings extending between the top and bottom surfaces, attaching a compliant layer to the top surface of the plate, the compliant layer having openings that are aligned with the openings extending through the plate, and providing electrically conductive features on the compliant layer. After making the subassembly, the bottom surface of the plate is attached with the top surface of a semiconductor wafer so that the openings extending through the plate are aligned with contacts on the wafer. At least some of the electrically conductive features on the compliant layer are electrically interconnected with the contacts on the semiconductor wafer.

12 Claims, 11 Drawing Sheets

U.S. PATENT DOCUMENTS

| | | |
|---|---|---|
| 2004/0082114 A1* | 4/2004 | Horng .................. 438/126 |
| 2004/0169278 A1* | 9/2004 | Kinsman ................ 257/737 |
| 2005/0073035 A1 | 4/2005 | Moxham |
| 2006/0055061 A1 | 3/2006 | Hosokawa et al. |
| 2006/0138626 A1 | 6/2006 | Liew et al. |
| 2006/0220262 A1 | 10/2006 | Meyer et al. |
| 2007/0132082 A1 | 6/2007 | Tang et al. |

FOREIGN PATENT DOCUMENTS

| | | |
|---|---|---|
| EP | 1041624 | 10/2000 |
| FR | 2704690 | 11/1994 |
| WO | 9940624 | 8/1999 |
| WO | 2005081315 | 9/2005 |

OTHER PUBLICATIONS

U.S. Appl. No. 60/936,617.
U.S. Appl. No. 60/850,850.
U.S. Appl. No. 60/963,209.
U.S. Appl. No. 60/964,069.

* cited by examiner

20

50

MICROELECTRONIC PACKAGES FABRICATED AT THE WAFER LEVEL AND METHODS THEREFOR

BACKGROUND OF THE INVENTION

The present invention generally relates to microelectronic packages and more particularly relates to microelectronic packages fabricated at the wafer level and to methods of making such packages.

Semiconductor chips are flat bodies with contacts disposed on the front surface that are connected to the internal electrical circuitry of the chip itself. Semiconductor chips are typically packaged with substrates to form microelectronic packages having terminals that are electrically connected to the chip contacts. The package may then be connected to test equipment to determine whether the packaged device conforms to a desired performance standard. Once tested, the package may be connected to a larger circuit, e.g., a circuit in an electronic product such as a computer or a cell phone.

The substrate materials used for packaging semiconductor chips are selected for their compatibility with the processes used to form the packages. For example, during solder or other bonding operations, intense heat may be applied to the substrate. Accordingly, metal lead frames have been used as substrates. Laminate substrates have also been used to package microelectronic devices. Such substrates may include two to four alternating layers of fiberglass and epoxy, wherein successive fiberglass layers may be laid in traversing, e.g., orthogonal, directions. Optionally, heat resistive compounds such as bismaleimide triazine (BT) may be added to such laminate substrates.

Tapes have been used as substrates to provide thinner microelectronic packages. Such tapes are typically provided in the form of sheets or rolls of sheets. For example, single and double sided sheets of copper-on-polyimide are commonly used for fine-line and high-density electronic interconnection applications. Polyimide based films offer good thermal and chemical stability and a low dielectric constant, while copper having high tensile strength, ductility, and flexure has been advantageously used in both flexible circuit and chip sized packaging applications. However, such tapes are relatively expensive, particularly as compared to lead frames and laminate substrates.

Depending on the configuration and other requirements of the microelectronic package, different substrate materials may be used. For example, in a flip-chip configuration, the front or contact-bearing surface of the microelectronic device faces towards a substrate. Each contact on the device is joined by a solder bond to a corresponding contact pad on the substrate, by positioning solder balls on the substrate or device, juxtaposing the device with the substrate, and momentarily reflowing the solder. Flip-chip configurations, however, may encounter problems in thermal expansion mismatch. When the coefficient of thermal expansion (CTE) for the device differs significantly from the CTE for the substrate, the solder connections will undergo fatigue when the package is thermally cycled. This is particularly problematic for flip-chip packages with fine pitch, small bumps, and/or large device footprints. Thus, to enhance reliability, the substrate is typically selected so that the CTE of the substrate closely matches the CTE of the device.

To improve productivity and reduce costs associated with microelectronic manufacturing, there have been many efforts directed to forming microelectronic packages at the wafer-scale level. Wafer-scale assemblies allow a plurality of devices in the form of a wafer to be packaged with a substrate as a single structure. Once formed, the wafer-scale structure is diced and separated into individual packages. However, problems associated with CTE mismatch between the wafer and the substrate are exacerbated due to the size of the wafer-scale structure. Thus, wafer-scale manufacturing of microelectronic packages may require exceptionally close matching of the CTE of the device and the substrate.

U.S. Pat. No. 6,753,208 to MacIntyre describes a chip scale package structure formed by adhering a glass sheet having a pattern of holes matching a pattern of bond pads on a semiconductor wafer so that the pattern of holes on the glass sheet are over the pattern of bond pads on the semiconductor wafer. Metallized pads are formed on the glass sheet adjacent each hole. A conductive trace is formed from each metallized pad on the glass sheet to the bond pad on the semiconductor wafer under the adjacent hole. In addition, the pad extends down the sides of the adjacent hole, which is then filled with a metal plug that electrically connects the pad on the glass sheet to the bond pad on the semiconductor wafer.

In certain embodiments of commonly assigned U.S. patent application Ser. No. 11/025,432, filed Dec. 29, 2004, the disclosure of which is hereby incorporated by reference herein, a microelectronic package includes a microelectronic device, a unitary ceramic substrate, and a plurality of terminals. The microelectronic device has a substantially planar front surface and a plurality of electrical contacts thereon. The substrate has a first substantially planar surface and a second surface opposing the first surface. A window extends from a first opening on the first surface and along a side wall to a second opening on the second surface. A conductive region may be provided on the side wall and/or the second substrate surface. Typically, but not necessarily, the window has varied cross-sectional areas along its lumen as defined by its side wall. The substrate is located between the device and the terminals such that the first surface of the substrate faces the front surface of the device and the first opening is aligned with at least one contact on the front device surface.

The device and the substrate disclosed in the '432 application may be coupled or decoupled to each other. However, there is typically substantially no void between the first surface of the substrate and the front surface of the device. For example, an adhesive may be provided between the device and the substrate. In addition, the package may include a compliant layer between the device and at least one terminal, e.g., between the at least one terminal and the substrate and/or between the device and the substrate. Accordingly, one or more terminals and the substrate may be coupled or decoupled to each other.

The device contacts of the '432 application electrically communicate with the terminals in any of a number of ways. For example, one or more device contacts may be provided in electrical communication with at least one terminal through the window via one ore more conductive regions. This may be achieved by lead bonding or wire bonding the contacts to the conductive region. Once electrical communication is achieved, an encapsulant may be dispensed into the window, optionally filling the window to a substantially void-free degree.

In further embodiments of the '432 application, a wafer-scale microelectronic assembly includes a wafer and a unitary ceramic substrate. The wafer includes an array of microelectronic devices each having a coplanar front surface and a plurality of electrical contacts thereon. The ceramic substrate has a first substantially planar surface and a second surface opposing first surface. One or more windows extend from a first opening on the first surface along a side wall to a second opening on the second surface. The windows may or may not have varied cross-sectional areas. One ore more conductive regions are located on at least one side wall or the second surface. The first surface of the substrate faces the front device surfaces, and each first opening is aligned with at least one electrical contact, typically on different devices. When the wafer has a diameter of at least 200 mm, the substrate and the device may have coefficients of thermal expansion that differ by less than about 3.0 ppm/° C. In other embodiments, the substrate and the device may have coefficients of thermal expansion that differ by less than about 0.1 ppm/° C.

Microelectronic packages also include wafer level packages, which provide an enclosure for a semiconductor component that is fabricated while the die are still in a wafer form. The wafer is subject to a number of additional process steps to form the package structure and the wafer is then diced to free the individual die, with no additional fabrication steps being necessary. Wafer level processing provides an advantage in that the cost of the packaging processes are divided among the various die on the wafer, resulting in a very low price differential between the die and the component. Furthermore, the package footprint is identical to the die size, resulting in very efficient utilization of area on a printed circuit board (PCB) to which the die will eventually be attached. As a result of these features, die packaged in this manner are commonly referred to as wafer level chip sized package (WLCSP).

FIG. 1 shows a conventional wafer level chip sized package 20 including a silicon wafer 22 having a top surface 24 with contacts 26 and a bottom surface 28 remote from the top surface 24. The wafer level chip sized package includes a passivation layer 30 formed atop the first surface 24 of the wafer 22. A resin layer 32 is then formed atop the passivation layer 30, and conductive traces 34 are deposited atop the resin layer 32. A second resin layer 36 having one or more openings 38 is deposited over the conductive traces 34 and the first resin layer 32. Conductive masses such as solder bumps 40 may be placed through openings 38 for forming an electrical interconnection with the conductive trace 34.

Conventional wafer level packages share a common trait in that the elements required to form the package structure are built on the surface of the semiconductor wafer. This approach has the drawback that the finished high-value semiconductor wafer is subject to an appreciable number of additional process steps. Thus, a process failure during any one of the packaging steps risks loss of the entire wafer. Thus, there is a need for an alternative approach to building most of the elements of wafer level packages so as to avoid loosing entire wafers during the packaging processes.

In spite of the above advances, there remains a need for improved wafer-scale packages that are cheaper, smaller and lighter and to methods of manufacturing such wafer-scale packages that are economical and reliable.

SUMMARY OF THE INVENTION

In one embodiment of the present invention, a method of making microelectronic packages includes making a subassembly by providing a plate having a top surface, a bottom surface and openings extending between the top and bottom surfaces, attaching a compliant layer to the top surface of the plate, the compliant layer having openings that are aligned with the openings extending through the plate, and providing electrically conductive features on the compliant layer. The electrically conductive features may include conductive traces, conductive bond ribbons, conductive terminals, conductive bumps, solder masses, conductive bond pads and/or conductive posts. A dielectric material such as a solder mask or a dielectric film may be provided over at least one of the electrically conductive features on the compliant layer.

After making the subassembly, a semiconductor wafer having a top surface and contacts accessible at the top surface is juxtaposed with the plate. The bottom surface of the plate is attached to the top surface of the semiconductor wafer so that the openings extending through the plate are aligned with the contacts on the wafer. At least some of the electrically conductive features on the compliant layer are electrically interconnected with the contacts on the semiconductor wafer. The electrical interconnections may be made by forming a wire bond between the contacts on the wafer and the electrically conductive features on the compliant layer. After the electrically interconnecting step, the wire bonds may be encapsulated with an encapsulant material such as an epoxy, a silicone or a compliant material. The encapsulant may be transparent, opaque, or have a level of transparency that falls anywhere between transparent and opaque.

In certain embodiments, the compliant layer is attached to the plate using an adhesive and the plate is attached to the semiconductor using an adhesive. The adhesive is preferably attached to the bottom of the plate before the plate is abutted against the semiconductor wafer. The plate is desirably made of a dielectric material. The plate may be rigid and preferably has a coefficient of thermal expansion that matches the coefficient of thermal expansion of the semiconductor wafer. The plate may be made of a material selected from the group consisting of glass and silicon.

In one embodiment, the openings in the plate have larger diameters at the top surface of the plate and smaller diameters at the bottom surface of the plate. The openings in the plate preferably have side walls, which may be tapered between the top and bottom surfaces of the plate. The electrically conductive features desirably extend into the openings in the plate. At least some of the side walls may include a ledge and the electrically conductive features may extend onto the ledges.

In another embodiment of the present invention, a method of making microelectronic packages includes making a subassembly by providing a plate having a top surface, a bottom surface, and openings extending between the top and bottom surfaces, the plate including ledges extending into each opening so that each opening has a larger diameter adjacent the top surface of the plate and a smaller diameter adjacent the bottom surface of the plate. The method includes attaching a compliant layer to the top surface of the plate, the compliant layer having openings that are aligned with the openings extending through the plate, and providing electrically conductive features on the compliant layer, whereby at least some of the electrically conductive features extend onto and/or are provided on the ledges extending into each of the openings. At least some of the electrically conductive features are accessible at the top surface of the compliant layer. After the subassembly is made in accordance with the steps outlined above, the bottom surface of the plate is juxtaposed with a semiconductor wafer having a top surface and contacts accessible at the top surface. The bottom surface of the plate is attached with the top surface of the semiconductor wafer so that the openings extending through the plate are aligned with the contacts on the wafer. The contacts on the wafer are desirably electrically interconnected with the electrically conductive features provided on the ledges. After the electrically interconnecting step, the semiconductor wafer may be diced or severed to provide a plurality of microelectronic packages having one or more die.

In one embodiment, the compliant layer may include a plurality of compliant bumps that are spaced from one another. In other embodiments, the electrically conductive features may be formed by plating conductive posts atop the conductive features so that the conductive posts project from the top surface of the compliant layer.

In another embodiment of the present invention, a method of making microelectronic packages includes providing a plate having a top surface, a bottom surface and openings extending between the top and bottom surfaces, attaching a flexible dielectric substrate to the top surface of the plate, the flexible dielectric substrate having openings extending therethrough that are aligned with the openings extending through the plate, and providing electrically conductive features on the flexible dielectric substrate, such as conductive terminals, conductive pads, conductive traces, conductive posts, etc. The method desirably includes providing a semiconductor wafer having a top surface and contacts accessible at the top surface and attaching the bottom surface of the plate with the top surface of the semiconductor wafer so that the openings extending through the plate are aligned with the contacts on the wafer. At least some of the electrically conductive features on the flexible dielectric substrate are desirably electrically interconnected with the contacts on the semiconductor wafer. The flexible dielectric substrate may be compliant and/or a compliant layer may be provided between the flexible dielectric substrate and the plate.

In yet another embodiment of the present invention, a method of making a microelectronic assembly includes making a subassembly by providing a plate having a top surface, a bottom surface and openings extending between the top and bottom surfaces, and attaching a compliant layer to the top surface of the plate. The compliant layer may have openings that are aligned with the openings extending through the plate. The method desirably include providing electrically conductive features on the compliant layer, and after making the subassembly, juxtaposing the bottom surface of the plate with a semiconductor wafer having a top surface and contacts accessible at the top surface. The bottom surface of the plate is desirably attached with the top surface of the semiconductor wafer so that the openings extending through the plate are aligned with the contacts on the semiconductor wafer. At least some of the electrically conductive features on the compliant layer are desirably electrically interconnected with the contacts on the semiconductor wafer.

The attaching a compliant layer step may include disposing an adhesive layer between the compliant layer and the top surface of the plate for attaching the compliant layer to the plate. The step of attaching the bottom surface of the plate to the wafer may include applying a second adhesive layer to the bottom surface of the plate and abutting the second adhesive layer against the top surface of the semiconductor wafer.

In certain embodiments, the plate may have a thickness that varies. In one embodiment, the plate has a reduced thickness adjacent at least one of the openings extending through the plate. The plate may have a shelf adjacent at least one of the openings extending through the plate, the shelf defining a wire bonding land that is located between the top surface of the plate and the bottom surface of the plate. The electrically conductive features on the compliant layer may include conductive traces with at least one of the conductive traces extending to the wire bonding land provided on the shelf of the plate. The electrically interconnecting step may include attaching a first end of a wire bond to one of the contacts on the semiconductor wafer and a second end of the wire bond to the wire bonding land provided on the shelf of the plate.

These and other embodiments of the present invention will be described in more detail below.

DETAILED DESCRIPTION OF PREFERRED EMBODIMENTS

The invention disclosed herein is not limited to the specific microelectronic devices or types of electronic products shown and described herein. Moreover, the terminology used herein is for the purpose of describing particular embodiments only, and is not intended to be limiting.

As used in this specification and the appended claims, the singular article forms "a," "an," and "the" include both singular and plural items unless the context clearly dictates otherwise. Thus, for example, reference to "a conductive region," includes a plurality of conductive regions as well as a single conductive region. Reference to "a microelectronic device" includes a single device as well as a combination of devices, and the like.

In addition, terminology indicative or suggestive of a particular spatial relationship between elements of the invention is to be construed in a relative sense rather than an absolute sense unless the context of usage clearly dictates to the contrary. For example, the term "face-down" as used to describe the spatial orientation of the device does not necessarily indicate that the front surface of the device represents the lowest point of the device. In addition, a "substrate" is not necessarily located below another element, e.g., a microelectronic device of the microelectronic package. Thus, in a package that includes a substrate and a device in a face-down orientation, the substrate may be located above, at the same level, or below the front device surface depending on the package's orientation.

Figure 1:
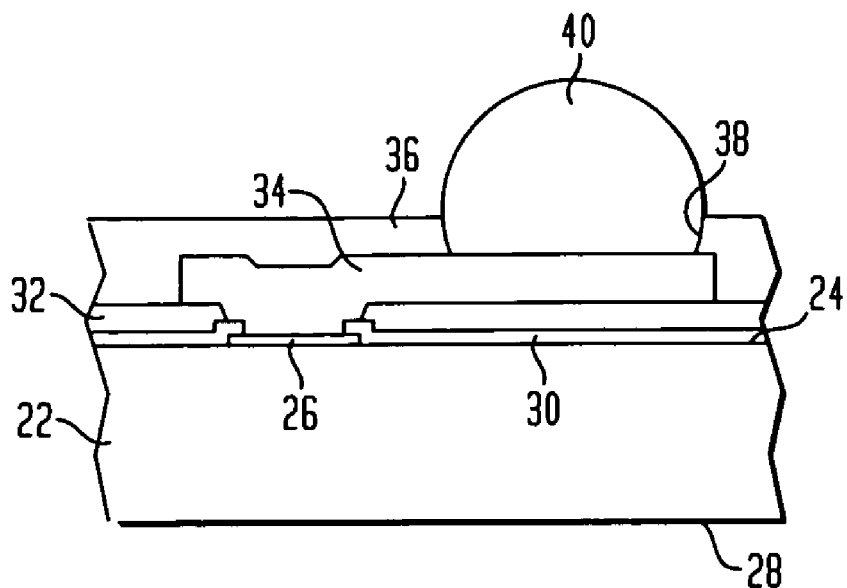
FIG. 1 shows a prior art microelectronic package.
Figure 2:
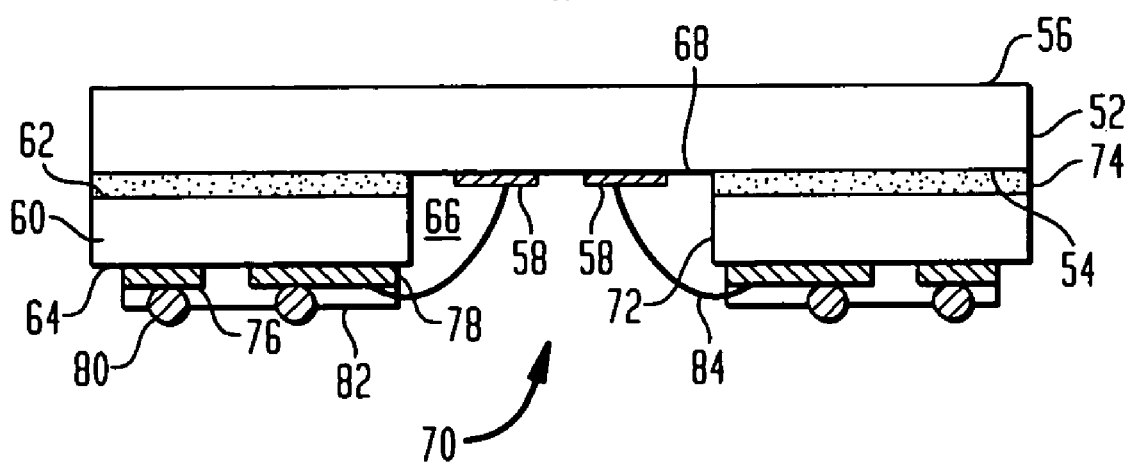
FIG. 2 shows a cross-sectional view of a microelectronic package.

FIG. 2 shows one embodiment of the '432 application mentioned above. Referring to FIG. 2, a microelectronic package 50 includes a microelectronic device 52 such as a chip or a wafer having a first major surface 54 and a second major surface 56. The first and second surfaces 54, 56 are substantially planar and parallel to each other. The first major surface 54 includes a plurality of electrical contacts 58.

As shown in FIG. 2, the microelectronic package 50 includes a substrate 60 having opposing first and second surfaces 62, 64 that are each substantially planar and parallel to each other. A window 66 extends from a first opening 68 on the first substrate surface 62 through the substrate 60 to a second opening 70 on the second substrate surface 64. As shown, the first and second openings 68, 70 are substantially identical in size, and the window 66 has a substantially constant cross-sectional area through its length. Thus, opposing portions of side walls 72 are parallel to each other. In certain embodiments, the substrate 60 may have a footprint that is substantially identical to that of the microelectronic device 52.

As shown in FIG. 2, the microelectronic device 52 is placed face-down on the substrate 60 so that the front surface 54 of the microelectronic device 52 faces the first surface 62 of the substrate 60, and the device contacts 58 are aligned with the window 66. As such, access to the contacts 58 may be provided through the window 66.

An adhesive 74 may be used to bond the microelectronic device 52 to the substrate 60. As shown in FIG. 2, the adhesive 74 is provided between the front surface 54 of the microelectronic device 52 and the first surface 62 of the substrate 60. Any of a number of adhesives known in the art may be used. For example, a curable liquid may be placed between the device 52 and the substrate 60 and subjected to curing conditions to form an adhesive polymer layer therebetween. Additional adhesives, e.g., pressure-sensitive adhesives or solvent containing adhesive solutions may be used as well.

A plurality of terminals 76 are provided on the second surface 64 of the substrate 60. Electrically conductive regions 78 in the form of wiring traces may be provided in electrical communication with the terminals. The terminals and the wire traces may comprise one or more electrically conductive materials, and may be formed of the same or different materials.

The substrate 60 and the terminals 76 may be provided as a unitary item. That is, the substrate may be complete with conductive regions 78 in the form wire traces in contact with the terminals 76 before bonding to the microelectronic device 52. Solder 80 and solder resist 82 may be placed on the second surface 64 of the substrate 60 as well. Alternatively, the terminals 76, conductive regions 78, and/or solder 80 may be placed on the substrate 60 after the substrate is bonded to the microelectronic device 52.

As shown in FIG. 2, wires 84 may serve to provide electrical communication between the device contacts 58 and the terminals 76 via traces 78. In general, the wires may be made from any material used to form the conductive regions. To promote low inductance and capacitance, however, it is preferred that the wires be short. As shown, wires 84 are formed such that they do not protrude beyond the plane defined by the surface of the solder balls 80 opposing the surfaces in contact with the terminals.

Alternatively, the window in the substrate may have a different geometry and/or shape, whereby a first opening of the window has a smaller cross-sectional area than that of the second opening. The cross-sectional area of the larger opening may range from twice as large to many times larger than that of the smaller opening. Accordingly, as the window extends between the first and second openings, the window has varied cross-sectional areas along its lumen as defined by its side wall.

Figure 3:
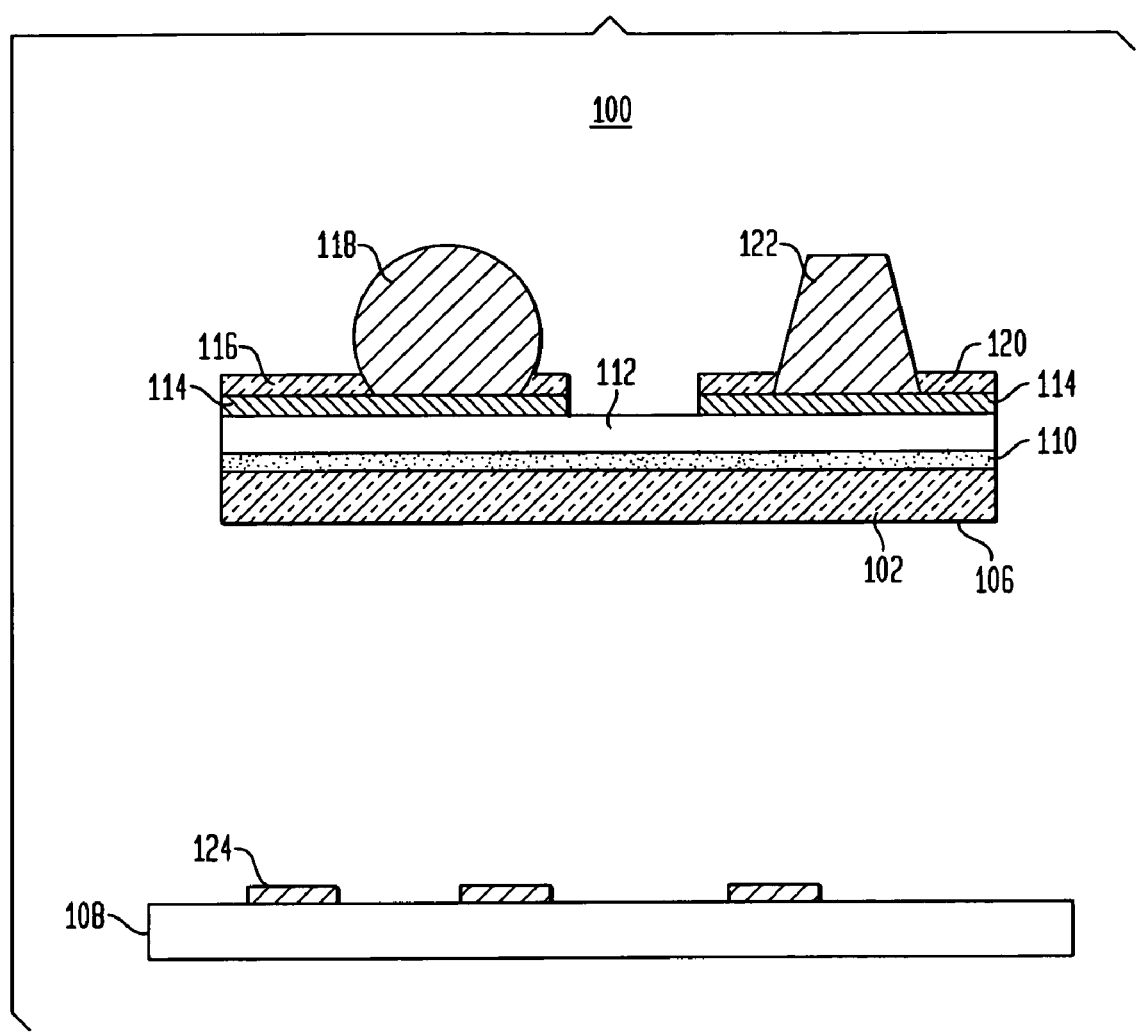
FIG. 3 shows a cross-sectional view of a microelectronic subassembly, in accordance with certain embodiments of the present invention.

Referring to FIG. 3, in certain embodiments of the present invention, a wafer level chip sized package 100 includes a plate 102 having a top surface 104 and a bottom surface 106 remote therefrom. The plate 102 is preferably made of a dielectric material such as glass or silicon. In certain embodiments, the plate 102 is rigid. The plate 102 preferably has a coefficient of thermal expansion (CTE) that is close to or matches the CTE of a semiconductor wafer 108 to which the plate 102 will be assembled. An adhesive layer 110 is preferably disposed atop the first surface 104 of the plate 102, and a compliant layer 112 is disposed atop the adhesive layer 110. Wiring traces 114 are preferably provided atop the compliant layer 112 for routing electrical signals over the subassembly. In one embodiment, a solder mask 116 having openings for receiving solder balls 118 may be provided. The solder mask 116 preferably covers the wiring traces 114 with openings being provided for the solder balls 118. In other embodiments, shown on the right side of the plate 102, a dielectric film 120 may cover wiring traces 114 and conductive posts or pins 122 may extend from the dielectric film 120. After the electrically conductive features have been formed atop the plate 102, the plate may be assembled with the wafer 108 and electrically interconnected with the conductive pads 124 on the wafer.

It is well known to those skilled in the art that semiconductor wafers are high value items. Thus, it is preferable to minimize as many handling or processing steps of the wafer as is possible, and the present invention seeks to limit the number of processing steps to an absolute minimal. In certain embodiments, the steps are limited to lamination of a subassembly to the wafer and wire bonding the electrical contacts on the subassembly with the conductive pads on a wafer. Both of these steps are well-known by those skilled in the art to be high yielding and easily accomplished. Thus, the basis of the present invention is to fabricate the elements of a wafer level package structure, i.e., redistribution, compliance, solder spheres, conductive protrusions, etc. on an intermediate plate. The intermediate plate is preferably a dielectric material such as glass or silicon that has a coefficient of thermal expansion that is close to or matches that of the semiconductor wafer. The intermediate plate is attached to the wafer only after most or all of the features necessary for forming a reliable electrical interconnection have been formed on the intermediate plate. Because the majority of the processing steps necessary to create the wafer level package are accomplished on the plate before the plate is assembled with the wafer, any yield loss at this preliminary stage does not involve a loss of a semiconductor wafer.

The close match in the coefficient of thermal expansion between the plate and the wafer is desirable because many adhesive joining processes used in the semiconductor industry involve using heat. If the coefficients of thermal expansion are not close or matched, the differences in expansion between the two parts can result in misalignment of the assembled package. Moreover, the fatigue life of the package will generally be longer when subject to thermal cycling or shock if the materials used to fabricate the package have coefficients of thermal expansion that are similar or matched.

Referring to FIG. 3, the plate 102, complete with its wafer level package structure, can be simply and easily attached to the wafer 108 using a thin film of adhesive (not shown). For this approach the work, however, it is necessary for there to be some means of forming electrical pathways between the conductive pads 124 on the wafer 108 and the conductive elements 118, 122 on the subassembly. One solution to this problem is for the intermediate plate to be fabricated with through holes at suitable locations. Then, using a mask or metallization process, conductive traces may be defined, either by vapor phase deposition or a plating process between the conductive pads on the wafer and the electrically conductive features on the subassembly.

Figure 4A:
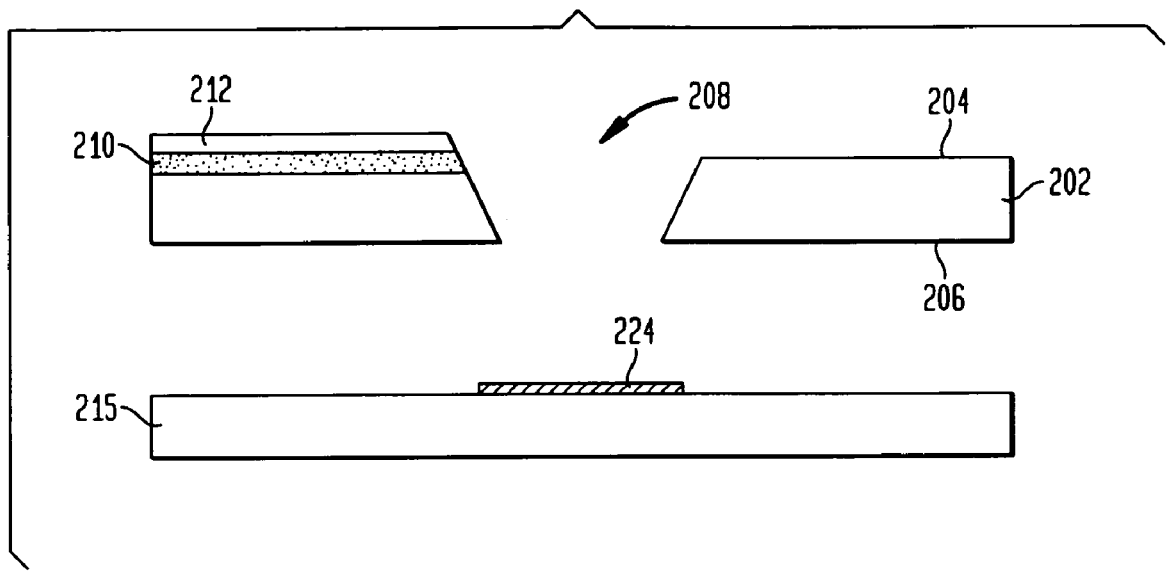
FIGS. 4A-4B show a method of making a microelectronic assembly, in accordance with certain embodiments of the present invention.
Figure 4B:
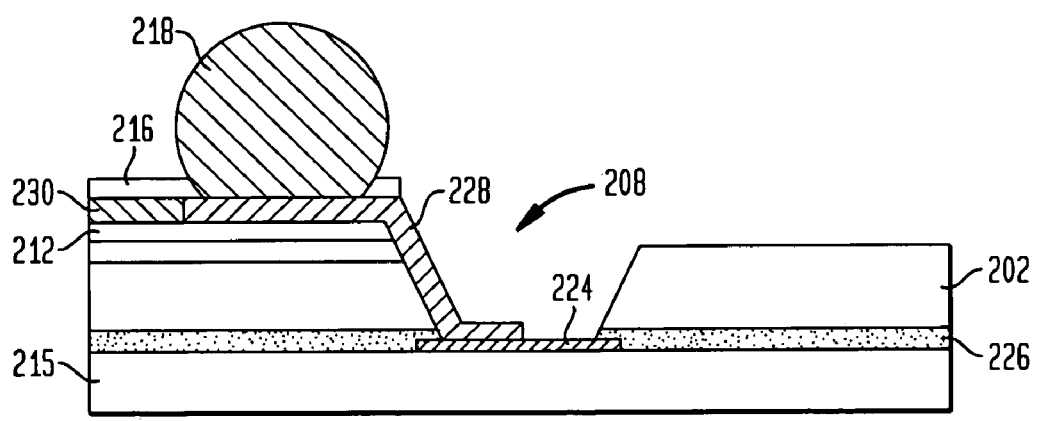

FIGS. 4A and 4B show a method of making a wafer level chip sized package, in accordance with certain embodiments of the present invention. Referring to FIG. 4A, a plate 202 has a top surface 204, a bottom surface 206 and an opening 208 extending between the top and bottom surfaces. An adhesive layer 210 is used for attaching a compliant layer 212 over the top surface 204 of the plate 202. The subassembly including the plate 202, the adhesive layer 210 and the compliant layer 212 is juxtaposed with a semiconductor wafer 215 having one or more contacts 224.

Referring to FIGS. 4A and 4B, the opening 208 extending through the plate 202 is aligned with the contact 224 on the wafer 215. An adhesive layer 226 is deposited over the bottom surface 206 of the plate 202 and the plate is abutted against the wafer 215. Conductive traces 228 are formed using processes such as vapor phase or plating methods. The conductive traces 228 extend between the conductive pads 224 on the wafer 215 and conductive lands 230 atop the compliant layer 212. A solder mask layer 216 is provided atop the conductive land 230 and solder balls 218 are also provided atop the conductive land 230. Thus, the method shown in FIGS. 4A-4B minimizes the number of steps required for manufacturing a wafer level chip sized package. By performing at least some of the steps away from the semiconductor wafer, the chances of damaging the wafer during the manufacturing process are minimized.

Figure 5A:
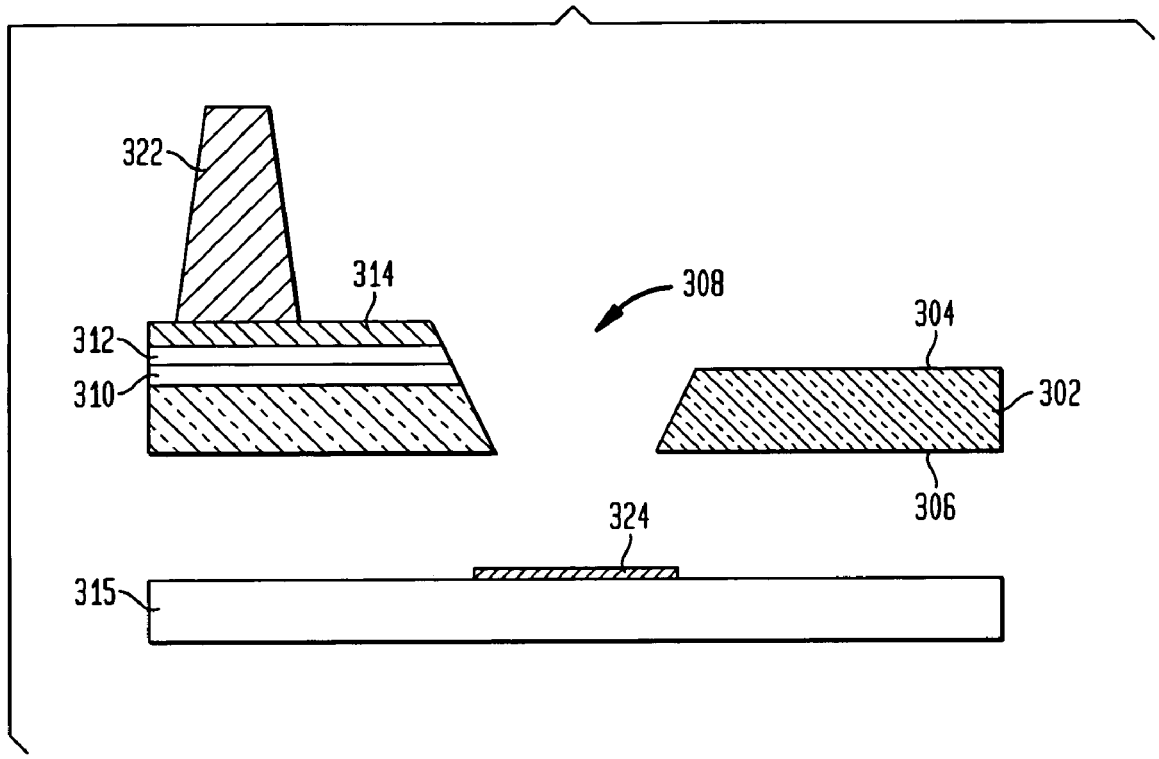
FIGS. 5A-5B show a method of making a microelectronic assembly, in accordance with another embodiment of the present invention.
Figure 5B:
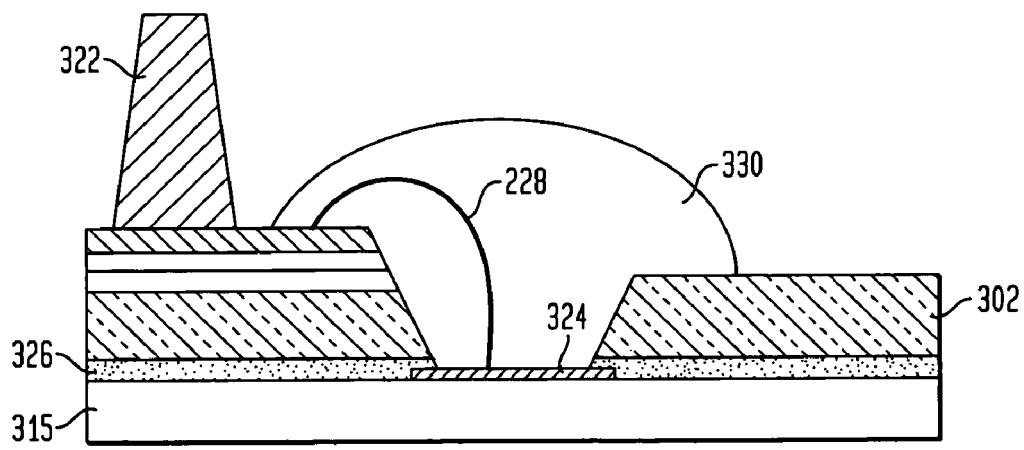

Referring to FIGS. 5A and 5B, in other embodiments of the present invention, a method of making a wafer level chip sized package includes providing a dielectric plate 302 having a top surface 304 and a bottom surface 306 remote therefrom. The dielectric plate includes one or more openings 308 extending between the top and bottom surfaces 304, 306. While the intermediate plate is separated from a semiconductor wafer 315, features for forming external electrical interconnections are provided atop the plate. As shown in FIG. 5A, an adhesive layer 310 is provided atop the first surface 304 of the plate 302 and a flexible dielectric substrate 312 having conductive traces 314 provided thereon is attached to the plate. A plurality of conductive posts 322 preferably project from the flexible dielectric substrate 312 and are electrically interconnected with the conductive traces 314. In FIGS. 5A and 5B, the conductive post is a "pin-out" post because it has a base that contacts an exterior surface of the dielectric substrate 312. In other embodiments, the conductive posts may be "pin-in" posts that extend at least part way through the dielectric substrate 312. Although "pin-out" structures are shown in most of the embodiments disclosed herein, it is contemplated that any of the embodiments of the present invention may include "pin-out" or "pin-in" posts, or a combination of "pin-out" and "pin-in" posts.

After the subassembly including the plate and the flexible dielectric substrate with conductive posts 322 has been assembled, the subassembly is juxtaposed with a semiconductor wafer 315 so that the bottom surface 306 of the plate 302 faces the contact bearing surface of the semiconductor wafer. In addition, the window 308 extending through the plate 302 is aligned with the conductive pads 324 providing on the semiconductor wafer 315.

Referring to FIG. 5B, an adhesive layer 326 is provided between the plate and the wafer for assembling the plate 302 with the wafer 315. After assembly of the plate 302 with the wafer 315, the conductive pads 324 are preferably accessible through the windows extending through the plate 302. In order to electrically interconnect the conductive posts 322 with the conductive pads 324 on the wafer 315, wire bonds 328 are utilized. The wire bonds 328 and the conductive pads 324 are covered by an encapsulant 330 to provide environmental and mechanical protection for the wafer level chip sized package.

Figure 6A:
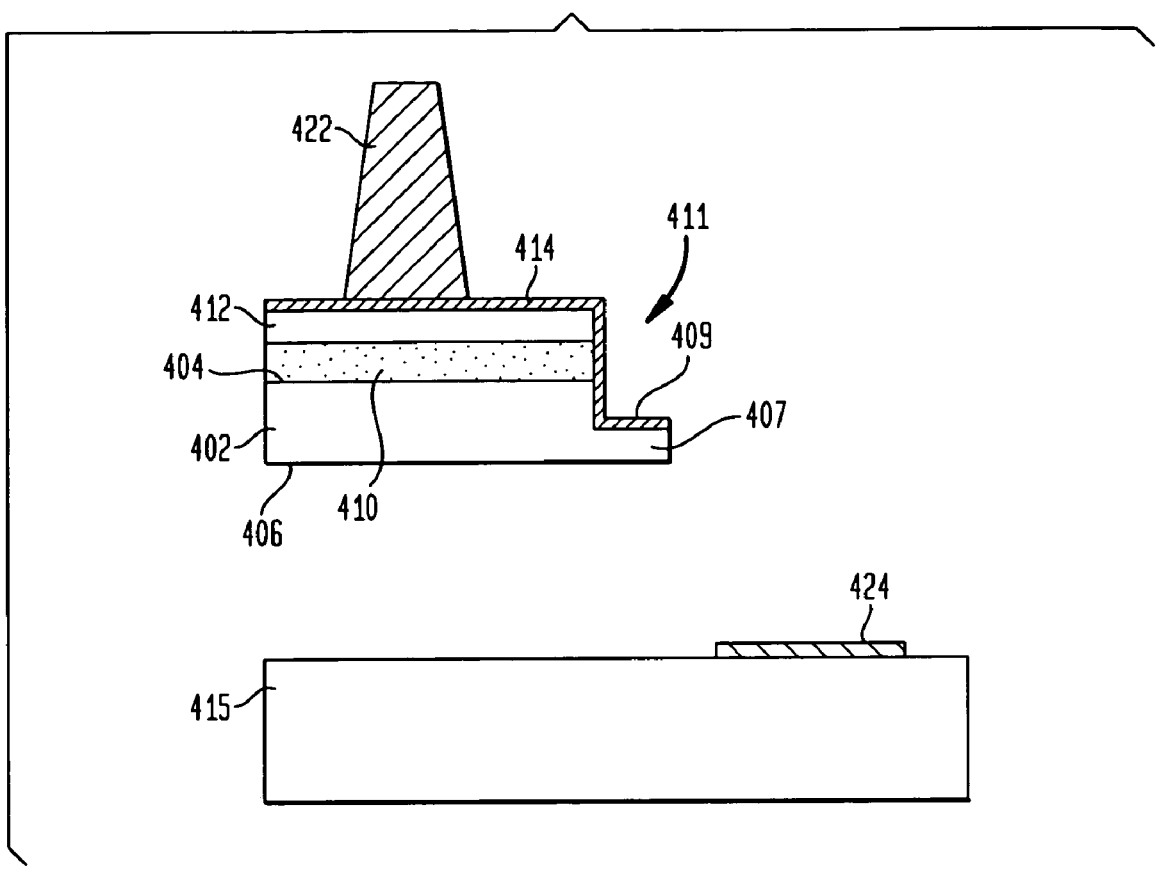
FIGS. 6A-6B show a method of making a microelectronic assembly, in accordance with further embodiments of the present invention.
Figure 6B:
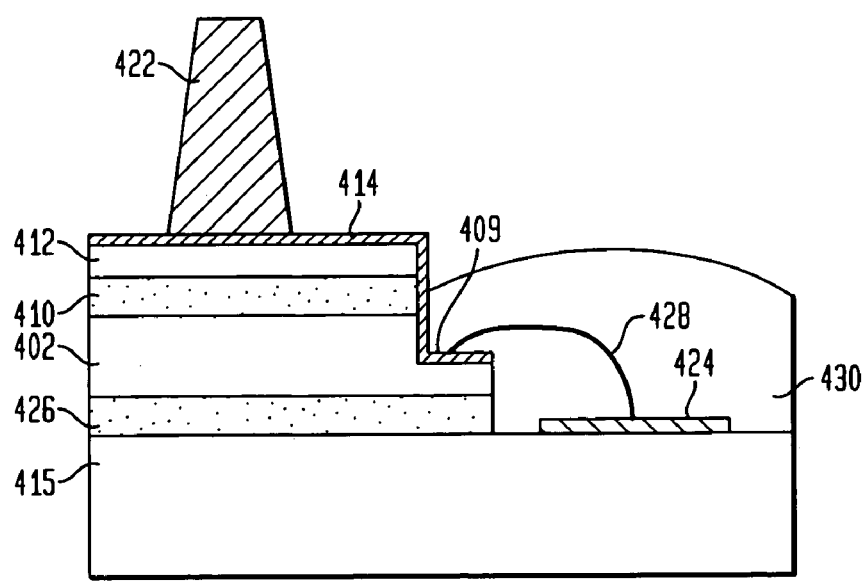

FIGS. 6A and 6B shown a method of making a wafer level chip sized package, in accordance with another embodiment of the present invention. Referring to FIG. 6A, a plate 402 has a top surface 404 and a bottom surface 406. The plate 402 includes a ledge 407 having an intermediate surface 409 that extends between the top and bottom surfaces 404, 406 of the plate 402. An adhesive layer 410 is provided over the top surface 404 of the plate 402 for securing a compliant layer 412 atop the plate. Metallization 414 is deposited atop the compliant layer 412. The metallization 414 preferably covers the ledge 407 of the plate 402 and a surface 411 that extends between the top of the compliant layer 412 and the intermediate surface 409 defined by the shelf 407. In the drawing figures, the metallized surface 411 appears to extend vertically, however, surface 411 is merely a near vertical surface that is provided to realize a compact structure. In one embodiment, well-known manufacturing methods will produce sloping surfaces or near vertical surfaces having an angle of less than 90°, more preferably between 45-89° and even more preferably between 70-85°. The metallization step may include masking and/or etching steps to provide conductive traces or conductive routing over the top of the compliant layer 412. Conductive posts 422 are provided atop the metallization layer 414.

After the subassembly shown in FIG. 6A has been formed, the bottom surface 406 is juxtaposed with a conductive pad bearing surface of a semiconductor wafer 415. The plate 402 preferably has a coefficient of thermal expansion that matches the coefficient of thermal expansion of the semiconductor wafer 415. The semiconductor wafer 415 has conductive pads 424 exposed at a top surface thereof.

Referring to FIG. 6B, the plate 402 is assembled with the semiconductor wafer 415 using a second adhesive layer 426. The ledge 409 is preferably positioned adjacent the conductive pad 424 on the wafer 415. A wire bond 428 is preferably used for electrically interconnecting the conductive pads 424 and the conductive land provided atop the ledge 409 of the plate 402. An encapsulant material 430 is desirably provided over the wire bond 428 and the ledge 409 of the plate. The encapsulant 430 also preferably covers the conductive pad 424 accessible through the opening in the plate 402.

Although the present invention is not limited by any particular theory of operation, it is believed that providing the plate 402 with a ledge enables the exposed surface of the encapsulant 430 to be flush or evenly recessed with respect to the conductive features 422, 414 provided at the exterior face of the subassembly. Thus, the ledge enables the encapsulant to have a lower overall height or profile, whereby the encapsulant 430 does not project above the compliant layer 412. The lower profile facilitates testing the wafer level chip sized package and mounting of the individual chip packages on a printed circuit board.

In one embodiment, in order to facilitate the creation of a low profile wire bond, a ball bond connection is formed with the conductive pad 424 and a wedge bond connection is formed with the conductive ledge 409. It is well-known to those skilled in the art that a wedge bond typically has a height that is ⅓ the height of a ball bond. Moreover, in a standard wire bonding step, the wire bond interconnect typically starts with a ball bond and terminates in a wedge bond. Thus, in some embodiments, it is preferable to first connect the wire bond with the conductive pad 424 on the wafer before connecting it with the conductive feature 409 provided on the ledge of the plate 402.

A standard wafer level chip sized package structure requires that a number of planar layers be built up on the surface of the wafer. These layers are mostly formed by dispensing a liquid that is cured to form a solid material. Conventionally, these curable materials are applied directly to the wafer surface for providing a number of functions such as mechanical protection of the wafer surface, environmental protection of the wafer surface and mechanical compliance between the solders sphere and the silicon die.

All but the very smallest wafer level chip sized packages require some mechanical compliance between the solders spheres used to attach the package to a printed circuit board and the die. Such compliance is required because silicon has a much lower of coefficient of thermal expansion than the materials used to make a printed circuit board. Thus, if the assembled package experiences changes in temperature, the printed circuit board and the die will expand and contract by different amounts, with the resulting differential strain inducing fatigue failure of the solder connections. By incorporating a low modulus but extremely elastic layer, i.e., a "compliant" layer in the assembly, the strain will be absorbed by that material rather than by the solders spheres.

Although the material selected for the compliant layer have low modulus, they also are predominately high thermal expansivity materials and undergo significant volume change on curing. This is due to the fact that the compliant layer having low modulus is typically a polymeric material. Due to the properties of the compliant layer, the application of thick layers of compliant material directly onto the surface of a semiconductor wafer will exert sufficient force on the semiconductor wafer to cause it to bow. As is well-known to those skilled in the art, semiconductor wafers must be manufactured to exacting standards of flatness because any bow or warp may create major problems with subsequent processes that involve spin-on films or optical alignment steps. For this reason, with conventional packages, the thickness of compliant films used to form wafer level chip sized packages is often less than ideal for maximum life and reliability of the solder interconnects to the printed circuit board.

In particular embodiments of the present invention, compliant layers of virtually any thickness may be provided over the intermediate plate (e.g., plate 302 in FIG. 5A). In certain embodiments, a compliant layer is provided on both sides of the intermediate plate. By providing the compliant layer on both sides of the intermediate plate, any warping or bowing forces may be balanced so as to prevent warp or bow of large area planar components. By converting a bi-layer stack of different materials to a tri-layer stack where the outer layers have similar mechanical properties that are different from those of the core material, the strain induced in the core material will be symmetric through its thickness. In the embodiments shown in FIGS. 5B and 6B, prior to attachment to the silicon wafer, the complete subassembly has a compliant structure on one surface of the plate and an adhesive film on the other surface of the plate. Thus, by judicious choice of the compliant and adhesive materials and their relative thicknesses, the intermediate plate may be engineered to be free of bow and warp.

In other embodiments, the compliant layer may comprise a plurality of compliant bumps that are provided on one surface of the intermediate plate. This structure, commonly referred to as islanding of the compliant layer, is possible because the intermediate plate provides the required environmental and mechanical protection to the semiconductor wafer in the area between the compliant bumps. In conventional wafer layer chip sized packages, if the compliant layer is discontinuous, there will be regions of the wafer surface that are exposed and that are therefore vulnerable to damage. With islands of compliant bumps, however, subdivision of the compliant layer prevents the accumulation of differential strain so that the wafer remains flat.

Figure 7:
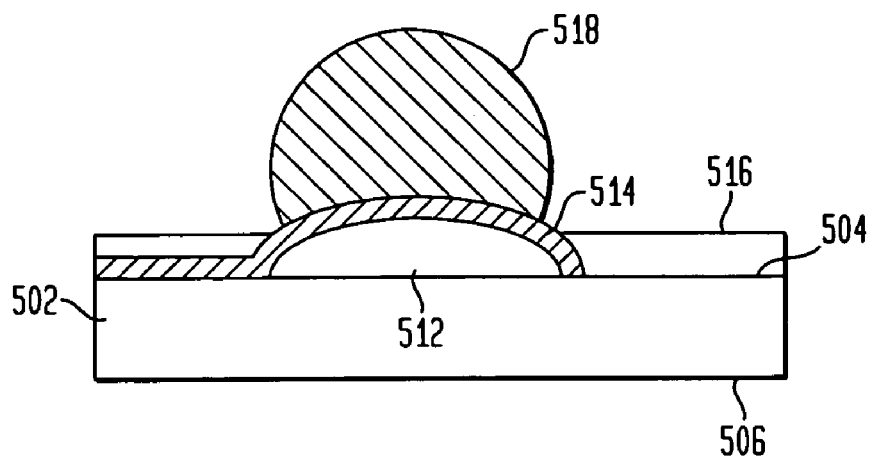
FIG. 7 shows a subassembly for a microelectronic assembly, in accordance with one embodiment of the present invention.

Referring to FIG. 7, in one embodiment, a microelectronic subassembly 500 includes a plate 502 having a top surface 504 and a bottom surface 506. A plurality of compliant bumps 512 are deposited atop the top surface 504 of the plate 502. Conductive traces 514 are provided over the top surface 504 of the plate and extend over at least some of the plurality of compliant bumps 512. A solder mask layer 516 may be provided over the top surface 504 of the plate 502. The solder mask layer 512 preferably covers portions of the traces 514. The portions of the traces overlying some of the compliant bumps 512 project beyond the top of the solder mask layer 516. Conductive elements such as solder balls 518 may be provided atop the conductive traces overlying the compliant bumps 512.

In certain embodiments, the compliant bumps may be disposed atop the plate 502 using deposition processes such as screen printing whereby a controlled quantity of curable material may be deposited at defined locations. In certain embodiments, silicones are deposited and cured as relatively tall sessile drops. In other embodiments, photo-imageable materials may be applied as a film and then selectively removed to yield similar structures.

Figure 8:
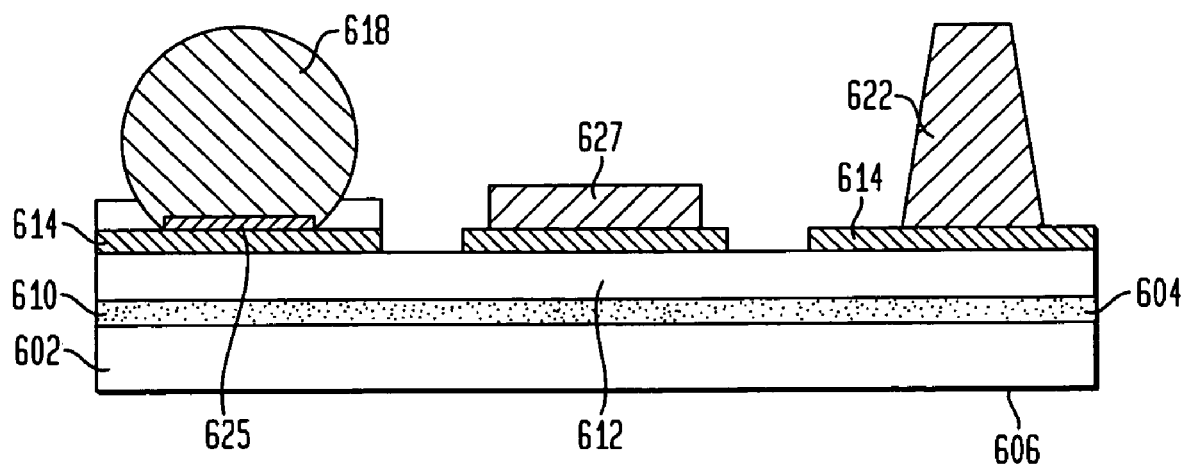
FIG. 8 shows a subassembly for a microelectronic assembly, in accordance with another embodiment of the present invention.

FIG. 8 shows some of the electrically conductive features that may be used for electrically interconnecting any of the packages disclosed herein with an external element such as a printed circuit board or test board. As shown in FIG. 8, an intermediate plate 602 has a top surface 604 and a bottom surface 606. A compliant layer 612 is attached to the top surface 604 of the plate 602 using an adhesive 610. Conductive traces 614 are provided atop the compliant layer 612. The conductive traces preferably route signals over the compliant layer. The conductive traces may be formed by selectively depositing a conductive material atop the compliant layer. The conductive traces may also be formed by selectively removing material to leave the conductive traces atop the compliant layer. In one embodiment, an external electrical interconnection may be provided by forming a metal pad 625 atop a conductive trace 614 and providing a solder sphere 618 atop the metal pad 625. In another embodiment, shorter conductive posts 627 may be formed atop the conductive traces 614. In yet another embodiment, taller conductive posts 622 may be formed atop the conductive traces 614.

The formation of the shorter conductive post 627 and the taller conductive post 622 are particularly important in the present invention. This is because these structures may be formed using a plating operation. Although plating on wafers is practiced commercially, the number of process steps involved represents a significant risk to the final component yield. Furthermore, if the intermediate plate is made of glass or a similar material, such material is considerably more inert toward the constituents of the plating bath than silicon, thereby permitting a wider range of chemistries to be used, which provides material, process and economic advantages. As a result, the short or tall conductive posts 627, 622 may be formed of copper, silver, nickel, tin, gold or combinations of these metals either as alloys or in layers. Nickel and copper-based posts in particular can encompass a wide range of heights suitable for a number of applications.

Figure 9:
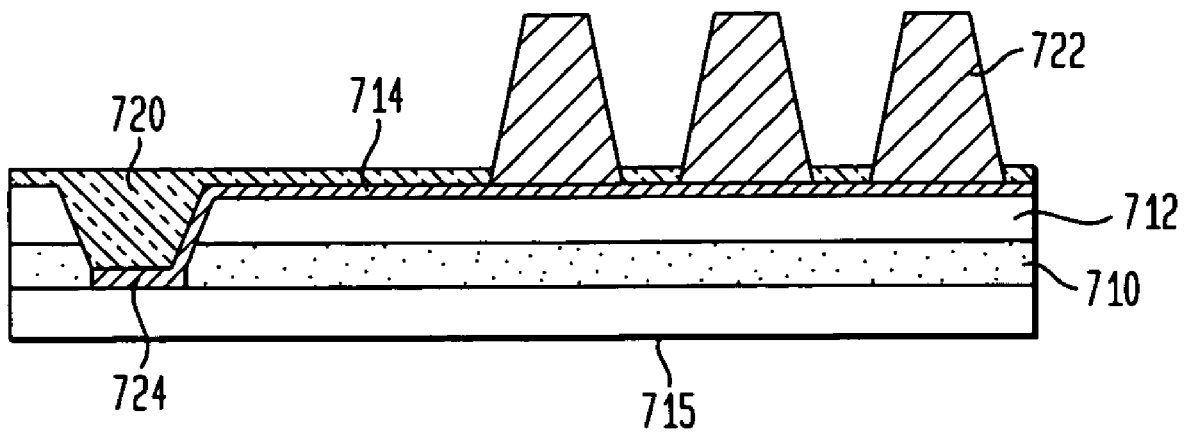
FIG. 9 shows a microelectronic assembly, in accordance with one embodiment of the present invention.

FIG. 9 shows a microelectronic assembly, in accordance with one embodiment of the present invention. The assembly includes a semiconductor wafer 715 having conductive bond pads 724 accessible at a top surface thereof. The assembly also includes an adhesive layer 710 for attaching a compliant layer 712 to the die 715. The adhesive layer 710 and the compliant layer 712 have openings aligned with the conductive bond pads 724 so that electrical interconnections may be made with the bond pads. Conductive metal 714 is deposited atop the compliant layer 712 and the bond pad 724. The conductive metal preferably extends over slopping surfaces of the adhesive layer 710 and the compliant layer 712. Conductive posts 722 are formed atop the conductive traces 714, at least some of the conductive posts 722 being electrically interconnected with the conductive bond pads 724 via the conductive traces 714. Dielectric material 720 may be provided over the conductive traces 714, the compliant layer 712 and around the bases of the conductive posts 722.

Figure 10:
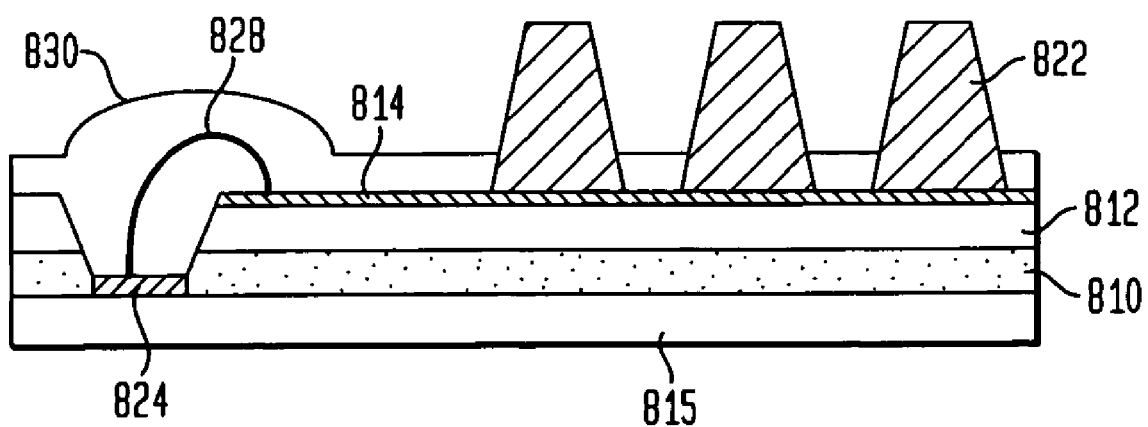
FIG. 10 shows a microelectronic assembly, in accordance with another embodiment of the present invention.

FIG. 10 shows a microelectronic assembly in accordance with another embodiment of the present invention including a semiconductor die 815 having conductive bond pads 824 provided on a surface thereof. The assembly includes an adhesive layer 810 for attaching a compliant layer 812 to the wafer 815. Conductive traces 814 are provided over the compliant layer 812 and conductive posts 822 are disposed atop the conductive traces. The conductive posts 822 are electrically interconnected with the conductive bond pads 824 using wire bonds 828, which are then encapsulated using an encapsulant material 830.

Figure 11A:
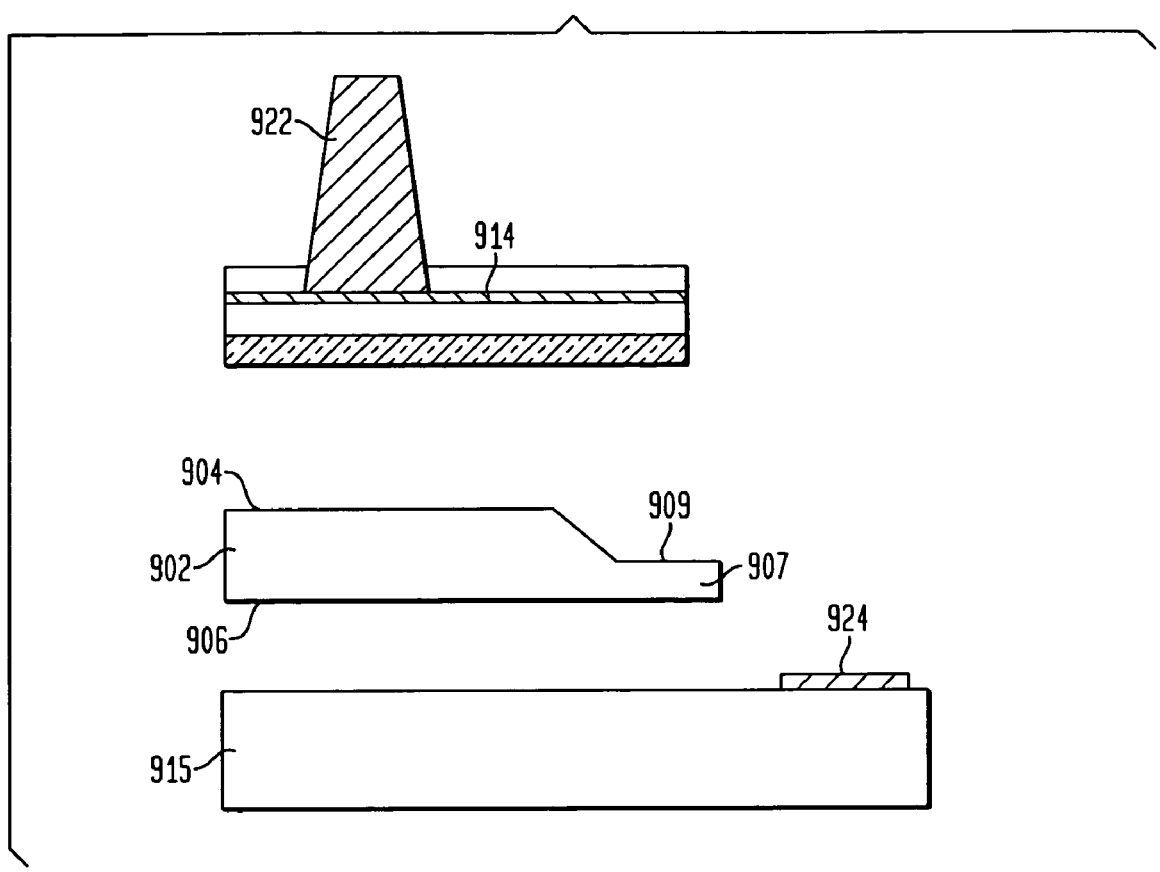
FIGS. 11A-11B show a method of making a microelectronic assembly, in accordance with other embodiments of the present invention.

Referring to FIG. 11A, in one embodiment of the present invention, a microelectronic assembly includes a semiconductor wafer 915 having conductive pads 924 accessible at a top surface thereof. The assembly includes an intermediate plate 902 having a top surface 904 and a bottom surface 906. The intermediate plate 902 includes a shelf 907 having a top surface 909 that lies between the top surface 904 and the bottom surface 906 of the plate. A flexible dielectric substrate 980, such as a flexible polyimide film, is provided. The flexible dielectric substrate 980 is a flexible circuit having conductive traces 914 provided thereon and conductive posts 922 projecting therefrom. The conductive posts are preferably electrically interconnected with the conductive traces 914. In certain embodiments, the conductive posts may be pin-in posts that extend at least part way through the dielectric sheet 980. In other embodiments, the conductive posts may be pin-out structures that have bases that abut against an exterior surface of the flexible dielectric sheet.

Figure 11B:
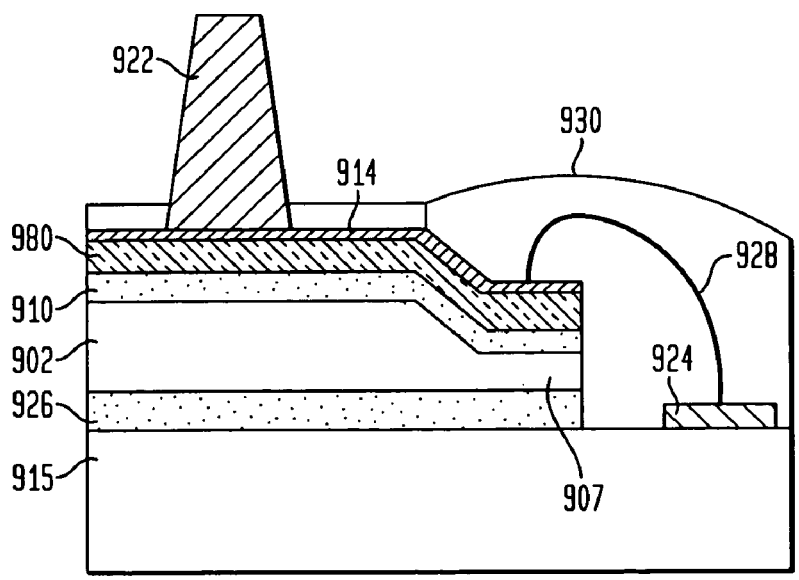

Referring to FIG. 11B, the flexible dielectric substrate 980 is secured atop the intermediate plate 902 using a first adhesive layer 910. The substrate 980 preferably conforms to the shape of the top surface of the plate 902. A second adhesive layer 926 is then provided over the bottom surface of the intermediate plate 902. The subassembly of the flexible dielectric substrate 980 and the intermediate plate 902 is then assembled with a top surface of the semiconductor wafer 915. As noted above, the flexible dielectric substrate is able to flex and bend so that it conforms to the shape of the plate including the shelf 907 of the plate. Conductive wires 928 are then used for electrically interconnecting the conductive traces 914 with the conductive bond pads 924. An encapsulant material 930 is provided atop the conductive wires 928 and the conductive bond pads 924. The shape of the intermediate plate 902 including the shelf 907 provides a lower overall height for the wire bond 928 and the encapsulant material 930.

In the assembly shown in FIG. 11B, the intermediate plate 902 preferably has a coefficient of thermal expansion that is close to or matches the coefficient of thermal expansion of the semiconductor wafer 915. The intermediate plate is preferably made of a relatively stiff material such as glass or another silicon wafer. The intermediate plate 902 preferably has stepped openings similar to those shown in FIG. 11B to provide access to conductive bond pads on the wafer.

Although the present invention is not limited by any particular theory of operation, it is believed that providing an intermediate plate having a structure shown in FIGS. 11A and 11B provides a number of advantages. First, the intermediate plate 902 may be fabricated with exceptionally smooth and parallel surfaces. As a result, a relatively thin adhesive layer 910, preferably less than 10 µm thick, may be used to attach the flexible dielectric substrate 980 thereto. As is well known to those skilled in the art, a thin layer of adhesive will uniformly constrain the low modulus flexible dielectric substrate 980 so that during thermal expansion and contraction of the assembly the dimensions of the flexible dielectric substrate 980 will more closely track that of the intermediate plate 902. Second, the intermediate plate 902 will generally reinforce the silicon wafer and decrease the effects of warp and bow to within tolerable limits. These benefits are further augmented by the thin layer of adhesive 910 between the flexible dielectric substrate 980 and the intermediate plate 902, which will force the flexible dielectric substrate 980 to conform in planarity to the intermediate plate 902. The combined effect is that the conductive posts 922 will be planar over the entire area of the structure and will therefore be compatible with a wafer scale probe card or printed circuit board. In addition, because the intermediate plate 902 has a finite thickness, it can have stepped ledges at the periphery of the openings that are required for the wire bond connections. By recessing the ledges, the wire bonds plus the protective encapsulant coating can be contained within the thickness of the intermediate plates. As a result, the conductive posts 922 are free to function unimpeded and in the manner designed.

The microelectronic assembly shown in FIGS. 11A and 11B will generally reduce the cost of manufacture and improve the yield of functional die. This is because the preferred order of assembly is to first laminate the flexible dielectric substrate 980 including the conductive posts 922 to the intermediate plate 902 and then attach the intermediate plate 902 to the semiconductor wafer 915. The assembly of the plate 902 to the wafer 915 occurs only after the flexible circuit subassembly has been inspected so that any defective parts can be corrected or rejected. Thus, the subassembly is only mated with the silicon wafer if the subassembly is functioning properly. Using this order of steps will maximize final device yield and minimize the likelihood that semiconductor wafers must be discarded or rejected.

In order to provide reliable electrical contacts to lands on a printed circuit board during electrical tests and subsequent solder attach processes, the conductive posts 922 are preferable finished with thin layers of nickel, then gold. These metals are preferably applied by a plating process. The nature of electro and electroless plating processes is that all exposed copper parts will be coated. However, as it is only the conductive posts 922 that need to be coated and gold is a relatively expensive metal, some reduction in part cost is likely if the flexile circuit is only coated with these metals after it has been cut to size and laminated to the intermediate plate. In structures that do not contain an intermediate plate, the semiconductor wafer must also be passed through the plating process, and hence it is at risk owing to breakage or process malfunction.

Figure 12A:
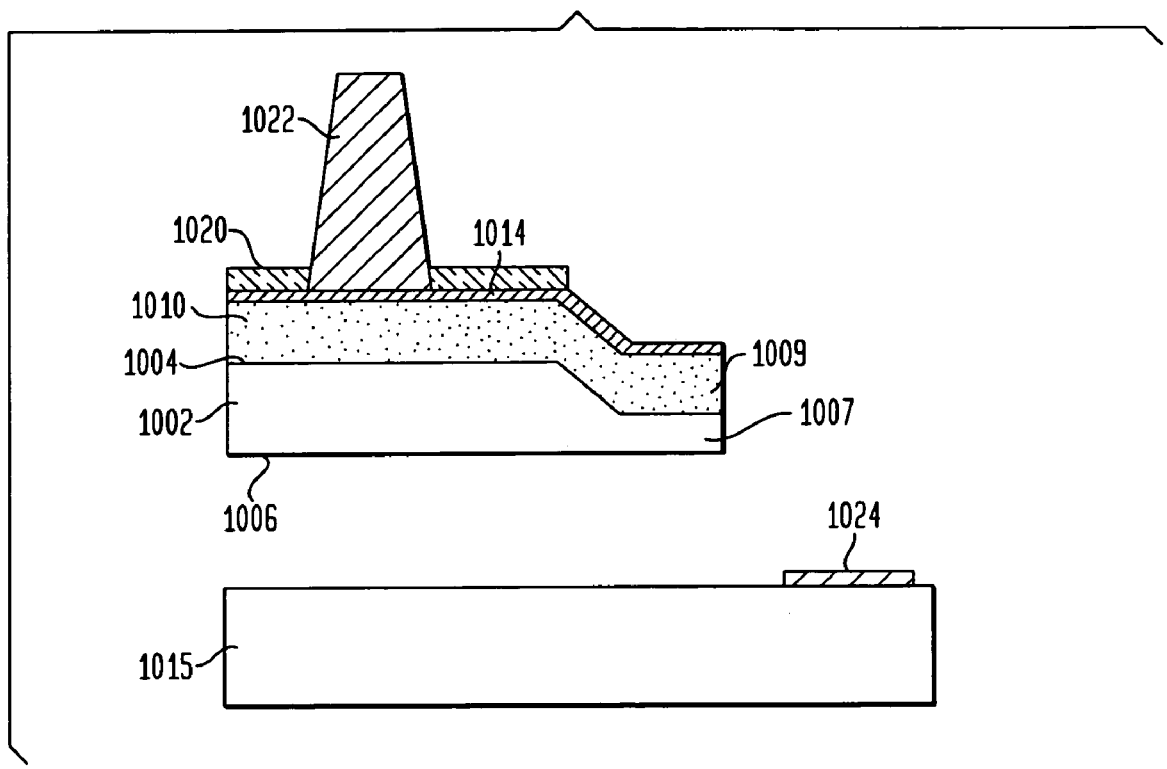
FIGS. 12A-12B show a method of making a microelectronic assembly, in accordance with another embodiment of the present invention.
Figure 12B:
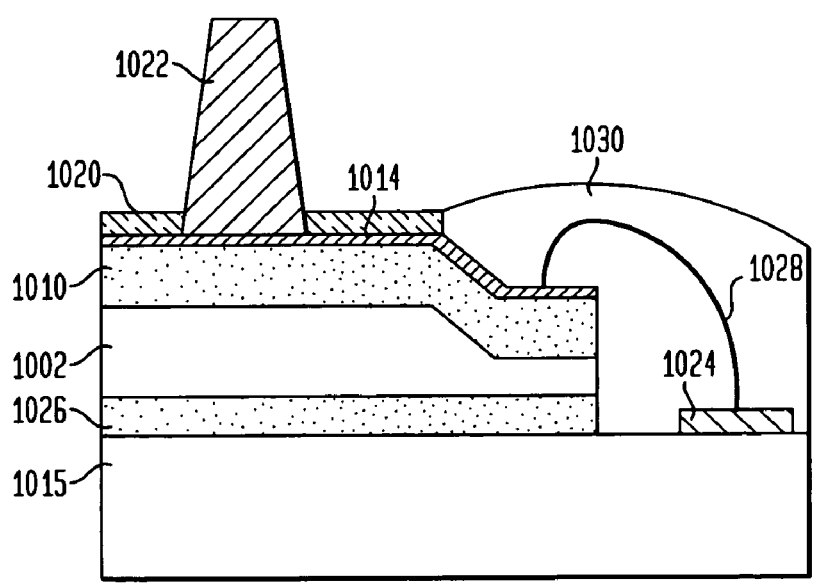

Referring to FIGS. 12A and 12B, in another embodiment of the present invention, a plate 1002 similar to that shown in FIG. 11A is provided. The plate 1002 includes a top surface 1004 and a bottom surface 1006. The plate 1002 also includes a shelf 1007 having an intermediate top surface 1009 that extends between top surface 1004 and bottom surface 1006. A layer of a compliant material such as a compliant adhesive 1010 is provided atop the intermediate plate 1002. The compliant adhesive layer 1010 follows the contour of the intermediate plate including the shelf 1007. Conductive traces 1014 are then provided atop the compliant adhesive layer 1010. Conductive posts 1022 are preferably electrically interconnected with the conductive traces 1014 and extend away from the intermediate plate 1002. A dielectric layer 1020 may be provided atop the conductive traces 1014 and preferably surround the bases of the conductive posts 1022. After the microelectronic subassembly shown in FIG. 12A has been completely formed atop the intermediate plate 1002, the subassembly is juxtaposed with a semiconductor wafer 1015 having conductive bond pads 1024.

Referring to FIG. 12B, the subassembly including the intermediate plate 1002, the compliant adhesive layer 1010 and the conductive posts 1022 is assembled with the wafer by providing an adhesive layer 1026 over the bottom surface of the intermediate plate 1002. The intermediate plate 1002 is then attached to the top surface of the wafer 1015 using the adhesive layer 1026. The microelectronic subassembly is electrically interconnected with the wafer 1015 using conductive bond wires 1028. The wire bonds 1028 have first ends electrically interconnected with conductive bond pads 1024 and second ends electrically interconnected with conductive traces 1014. An encapsulant material 1030 may then be provided over the wire bonds 1028 and the conductive bond pads 1024. A dielectric layer 1020 preferably covers the conductive traces 1014 and surrounds the bases of the conductive posts 1022.

In the microelectronic assembly shown in FIG. 11B, a flexible dielectric substrate 980 having conductive features is attached to an intermediate plate using a film of adhesive. In the particular embodiment shown in FIG. 12B, the dielectric substrate is eliminated and the electrically conductive components of the subassembly are directly attached to a compliant adhesive layer 1010. Removal of the dielectric substrate decreases the cost of the assembly and reduces the overall height and weight of the package.

The assembly shown in FIG. 11A is formed using a copper-nickel-copper tri-foil in which one of the copper films has a substantial thickness, typically 100 microns or more. A photolithographic imaging process may be used to define a wiring trace in the thin copper layer that is then chemically etched to remove the excess material. The thin nickel layer acts as an edge stop. The partially processed tri-foil is then laminated to a polyimide backing sheet. A second photolithographic imaging process is then used to define the tips of the conductive posts on the surface of the thick copper film. When the excess copper is removed, the result is an array of copper pillars of precisely controlled height, attached to a wiring trace and supported on a compliant polyimide film. To finish, the exposed copper is given a protective finish comprising a thin layer of nickel overlaid with gold and dielectric film is applied to the spaces between the pillars or posts to prevent accidental damage or connection to the wiring trace.

One of the difficulties of making the assembly shown in FIG. 11B is that the polyimide backing sheet is soft, elastic, and flexible. This makes it difficult and costly to maintain precise alignment between features, especially over large distances on semiconductor wafers and between batches of material. By adhesively bonding the flexible circuit to a rigid and low thermal expansivity plate after etching of the wiring trace, this problem is solved.

The availability of a rigid backing plate for the wiring traces and conductive posts affords the possibility of using plating technologies to form both features through a combination of etching and plating processes. Referring to FIGS. 13A-13D, in one embodiment, an intermediate plate 1102 has a top surface 1104 and a bottom surface 1106. An adhesive layer 1110 is deposited atop the top surface 1104 of the intermediate plate 1102. A copper foil 1114 is then provided atop the adhesive layer 1110 and etched to form conductive traces.

Figure 13A:
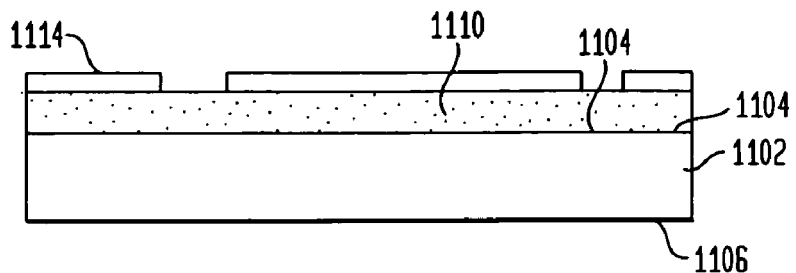
FIGS. 13A-13D show a method of making conductive posts on a microelectronic subassembly, in accordance with certain embodiments of the present invention.
Figure 13B:
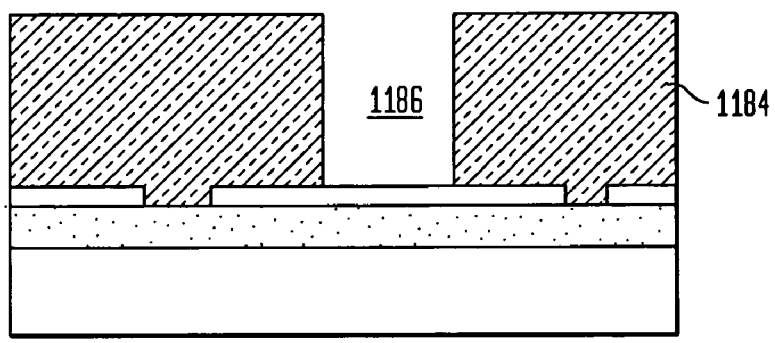
Figure 13C:
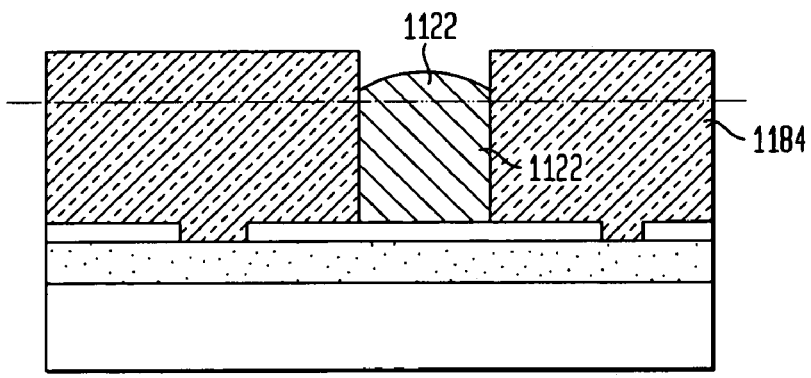

Referring to FIG. 13B, a layer of a photoresist material 1184 is then provided atop the conductive traces 1114 and the adhesive layer 1110. The photoresist layer 1184 is then patterned to form openings 1186 for forming conductive posts.

Figure 13D:
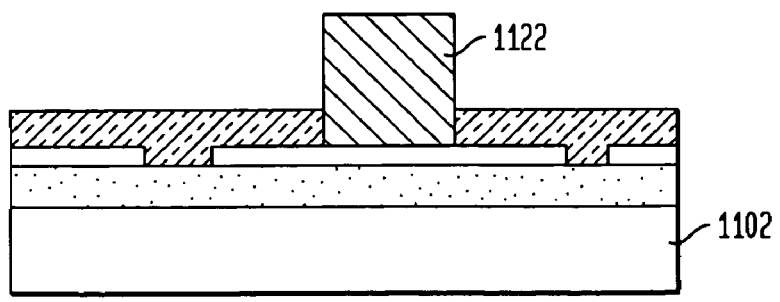

Referring to FIG. 13B, the openings of the photoresist layer 1184 are then filled with a conductive material 1122 such as copper. The conductive material 1122 may be deposited using an electroplating process. The subassembly is then polished so that all of the features have a common height. Referring to FIG. 13D, the photoresist layer may then be removed to provide a plurality of conductive posts 1122 projecting away from the intermediate plate 1102. The intermediate plate may then be assembled with a semiconductor wafer as described above.

Figure 14A:
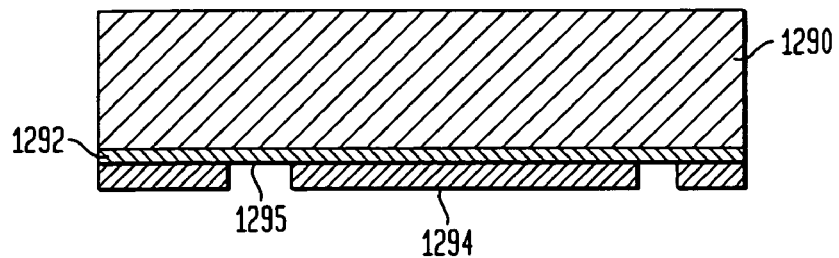
FIGS. 14A-14D show a method of making conductive posts on a microelectronic subassembly, in accordance another embodiment of the present invention
Figure 14B:
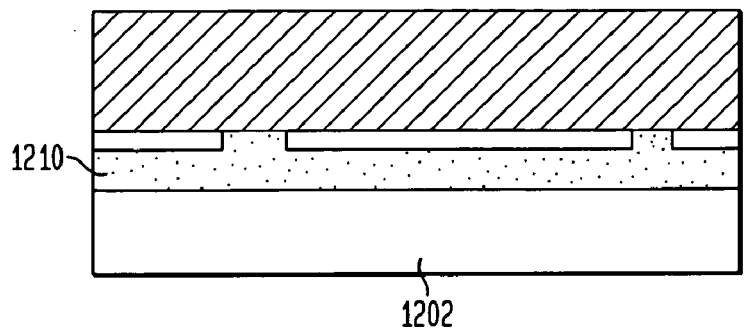
Figure 14C:
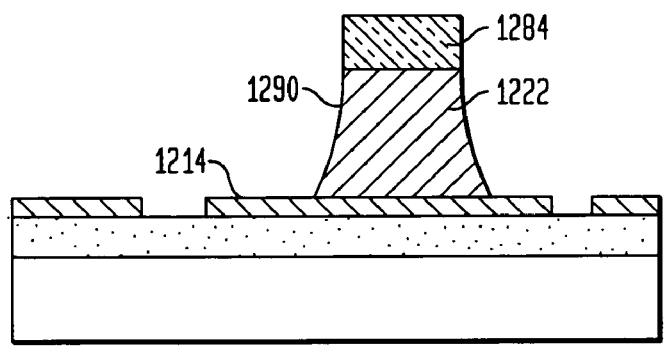
Figure 14D:
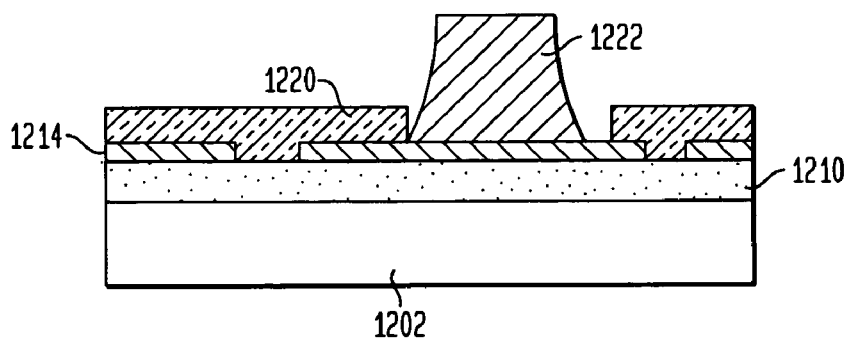

In another embodiment, referring to FIGS. 14A-14D, the conductive posts are formed using an etching step. Referring to FIG. 14A, a tri-metal foil includes a thick copper foil 1290, a thin copper foil 1292, and a photomask layer 1294 covering the thin copper foil 1292. The photomask layer 1294 includes openings 1295. Referring to FIGS. 14A and 14B, the thin copper foil present in the openings 1295 is etched away to form conductive traces. As shown in FIG. 14B, the subassembly of FIG. 14A is then adhered to intermediate plate 1202 using adhesive layer 1210. Referring to FIG. 14C, a photomask layer 1284 is then provided atop the thick copper layer 1290. The thick copper foil is then etched to form conductive posts 1222 that are electrically interconnected with the conductive traces 1214. Referring to FIG. 14D, the photo mask layer (1284) is removed to provide the conductive posts 1222. A layer of a dielectric film 1220 is desirably provided atop the conductive traces 1214 and the adhesive layer 1210.

Referring to FIG. 14D, after the pins have been etched, the residual photoresist material is removed and a nickel/gold finish applied to the side walls and ends of the conductive posts 1222. The nickel/gold finish may also be applied to the wire bond areas on the conductive traces 1214. All of the other metal surfaces are preferably covered with a dielectric film 1220. The structure in FIG. 14D has posts or pins that have wider diameter bases than at the tip, which serves to improve the mechanical robustness of the structure, while minimizing the contact area when the conductive posts connect to a printed circuit board.

One advantage of completing the fabrication of the conductive traces and posts after laminating them to the intermediate plate 1202 is a saving in the cost of nickel and particularly gold used as a surface finish. Flexible circuits are conventionally prepared in the form of large rectangular sheets of material, so that when immersed in the plating vats, all exposed metal will be coated with nickel and gold. With the structure shown in FIG. 14D, however, the only exposed metal areas are those regions where the relatively expensive metal finish is actually required. The reduction in area is significant (e.g. over 20%), resulting in a similar savings in nickel and gold electroplating solutions.

Variations of the present invention will be apparent to those of ordinary skill in the art in view of the disclosure contained herein. For example, while the unitary substrates have generally been depicted herein as formed from a single piece, a plurality of pieces may be joined to form a unitary substrate. In addition, solders, conductive pastes, and other electrical connection technologies known in the art may be employed to effect electrical communication between any items of the invention. Furthermore, the inventive packages and assemblies may serve to provide mechanical support to the packaged device or wafer to facilitate their back-grinding. Additional variations of the invention may be discovered upon routine experimentation without departing from the spirit of the present invention.

All patents and patent applications mentioned herein are hereby incorporated by reference in their entireties.

In certain embodiments of the present invention, a particle coating such as that disclosed in U.S. Pat. Nos. 4,804,132 and 5,083,697, the disclosures of which are incorporated by reference herein, may be provided on one or more electrically conductive parts of a microelectronic package for enhancing the formation of electrical interconnections between microelectronic elements and for facilitating testing of microelectronic packages. The particle coating is preferably provided over conductive parts such as conductive terminals or the tip ends of conductive posts. In one embodiment, the particle coating is a metalized diamond crystal coating that is selectively electroplated onto the conductive parts of a microelectronic element using standard photoresist techniques. In operation, a conductive part with the diamond crystal coating may be pressed onto an opposing contact pad for piercing the oxidation layer present at the outer surface of the contact pad. The diamond crystal coating facilitates the formation of reliable electrical interconnections through penetration of oxide layers, in addition to traditional wiping action.

As discussed above, the motion of the posts may include a tilting motion. This tilting motion causes the tip of each post to wipe across the contact pad as the tip is engaged with the contact pad. This promotes reliable electrical contact. As discussed in greater detail in the co-pending, commonly assigned application Ser. No. 10/985,126 filed Nov. 10, 2004, entitled "MICRO PIN GRID ARRAY WITH WIPING ACTION," the disclosure of which is incorporated by reference herein, the posts may be provided with features which promote such wiping action and otherwise facilitate engagement of the posts and contacts. As disclosed in greater detail in the co-pending, commonly assigned application Ser. No. 10/985,119 filed Nov. 10, 2004, entitled "MICRO PIN GRID WITH PIN MOTION ISOLATION," the disclosure of which is also incorporated by reference herein, the flexible substrate may be provided with features to enhance the ability of the posts to move independently of one another and which enhance the tilting and wiping action. The present application may also include one or more features of the embodiments disclosed in commonly assigned U.S. provisional application Ser. No. 60/753,605, filed Dec. 23, 2005, the disclosure of which is hereby incorporated by reference herein.

Although the invention herein has been described with reference to particular embodiments, it is to be understood that these embodiments are merely illustrative of the principles and applications of the present invention. It is, therefore, to be understood that numerous modifications may be made to the illustrative embodiments and that other arrangements may be devised without departing from the spirit and scope of the present invention as defined by the appended claims.

The invention claimed is:

1. A method of making microelectronic packages comprising:
    making a subassembly including
        providing a plate having a top surface, a bottom surface and openings extending between the top and bottom surfaces, said plate including ledges extending into each said opening so that each said opening has a larger diameter adjacent the top surface of said plate and a smaller diameter adjacent the bottom surface of said plate,
        attaching a compliant layer to the top surface of said plate, said compliant layer having openings that are aligned with the openings extending through said plate,
        providing electrically conductive features on said compliant layer, wherein at least some of said electrically conductive features extend onto said ledges;
    after making said subassembly, providing a semiconductor wafer having a top surface and contacts accessible at the top surface;
    attaching the bottom surface of said plate with the top surface of said semiconductor wafer so that the openings extending through said plate are aligned with the contacts on said wafer;
    electrically interconnecting the contacts on said semiconductor wafer with said electrically conductive features.

2. The method as claimed in claim 1, wherein the attaching said compliant layer to said plate step comprises using an adhesive to attach said compliant layer and said plate together.

3. The method as claimed in claim 1, wherein the attaching said plate to said semiconductor wafer comprises using an adhesive to attach said plate and said semiconductor wafer together.

4. The method as claimed in claim 1, wherein said plate and said semiconductor wafer having matching coefficients of thermal expansion.

5. The method as claimed in claim 1, wherein at least some of said electrically conductive features are selected from the group consisting of conductive traces, conductive bond ribbons, conductive terminals, conductive bond pads and conductive posts.

6. The method as claimed in claim 1, wherein at least some of said electrically conductive features are accessible at the top surface of said compliant layer.

7. The method as claimed in claim 1, wherein the electrically interconnecting step comprises forming wire bonds between the contacts on said wafer and the at least some of said electrically conductive features extending onto said ledges.

8. The method as claimed in claim 7, further comprising encapsulating said wire bond with an encapsulant material.

9. The method as claimed in claim 1, wherein said compliant layers comprises a plurality of compliant bumps that are spaced from one another.

10. The method as claimed in claim 1, further comprising, after the electrically interconnecting step, dicing said semiconductor wafer to provide a plurality of microelectronic packages.

11. The method as claimed in claim 1, further comprising plating conductive posts atop said conductive features so that said conductive posts project from the top surface of said compliant layer.

12. The method as claimed in claim 1, wherein said semiconductor wafer includes a plurality of die, and wherein at least one of said openings extending through said plate and said compliant layer is associated with one of said plurality of die.

* * * * *